(12) United States Patent
Rajsuman

(10) Patent No.: US 6,408,412 B1
(45) Date of Patent: Jun. 18, 2002

(54) METHOD AND STRUCTURE FOR TESTING EMBEDDED ANALOG/MIXED-SIGNAL CORES IN SYSTEM-ON-A-CHIP

(75) Inventor: Rochit Rajsuman, Santa Clara, CA (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/390,064

(22) Filed: Sep. 3, 1999

(51) Int. Cl.[7] ............................................... G06F 11/00
(52) U.S. Cl. ........................ 714/724; 714/738; 714/742
(58) Field of Search ................................ 714/724, 738, 714/739, 740, 742

(56) References Cited

U.S. PATENT DOCUMENTS 5,963,566 A * 10/1999 Rahsynab et al. .......... 714/733
5,991,898 A * 11/1999 Rajski et al. ................. 714/30
6,249,893 B1 * 6/2001 Rajsuman et al. .......... 714/741

* cited by examiner

Primary Examiner—Phung M. Chung
(74) Attorney, Agent, or Firm—Muramatsu & Associates

(57) ABSTRACT

A method of testing an embedded analog core in an integrated circuit chip having a microprocessor core and a memory core. The method includes the steps of providing a test register in the integrated circuit chip between the microprocessor core and an analog core to be tested, testing the microprocessor core and the memory core, using an assembly language test program running on the microprocessor core to generate a test pattern by the microprocessor core, applying the test pattern to the analog core by the microprocessor core and evaluating the response of the analog core either by the microprocessor core or a test system provided outside of the integrated circuit chip.

15 Claims, 4 Drawing Sheets

Fig.5

MVI 000H, (A1); Move all-0 to location addressed by A1, it provides all-0 vector
       MVI FFFH, (A1); Move all-1 to location addressed by A1, it provides all-1 vector /*Procedure to generate all code values*/

Start      MVI 0000H, D1; it sets register D1 to zero
       MVI 0100H, D2; it sets register D2 to $2^8$ for eight bit DAC. This number varies for different DAC, for example, for 10-bit DAC it needs to 0400H or $2^{10}$ Cont     CMP D1, D2; compare the content of D1 to D2
       JZ Stop
       MOVE D1, (A1); move contents of D1 to the location addressed by A1 that is test register of Fig 3 during test mode
       INCR D1; this generates the next code value
       JMP Cont

Stop     HLT

METHOD AND STRUCTURE FOR TESTING EMBEDDED ANALOG/MIXED-SIGNAL CORES IN SYSTEM-ON-A-CHIP

FIELD OF THE INVENTION

This invention relates to a method and structure for testing embedded cores in a system-on-a-chip (SoC) IC, and more particularly, to a method and structure for testing analog/mixed signal cores in a microprocessor based system-on-a-chip (SoC) IC.

BACKGROUND OF THE INVENTION

In recent several years, ASIC (application specific integrated circuit) technology has evolved from a chip-set philosophy to an embedded core based system-on-a-chip (SoC) concept. An SoC IC includes various reusable functional blocks, such as microprocessors, interfaces, memory arrays, and DSPs (digital signal processors). Such pre-designed functional blocks are commonly called "cores".

FIG. 1 is a schematic diagram showing an example of inner structure of such an SoC IC. In the example of FIG. 1, an SoC IC 10 includes a microprocessor core 12, memory cores 13–16, function specific cores 21–23, a phase lock loop (PLL) core 25, a test access port (TAP) 26, an A/D (analog-to-digital) and D/A (digital-to-analog) core 27, a PCI (interface) core 28, and a glue logic (support logic such as I/O). How to test such embedded cores is a new and complex problem in IC testing. The present invention is directed to a method and structure for testing such embedded cores, particularly, analog and/or mixed-signal cores, such as an analog-to-digital converter (ADC) and a digital-to-analog (DAC) converter in an SoC IC.

Testing of embedded analog/mixed-signal cores is considered a difficult problem in an SoC IC testing. In general, various design-for-test (DFT) schemes are used to access the embedded analog blocks such as digital-to-analog converters (DAC) and analog-to-digital converters (DAC), while the testing is performed by specialized hardware such as mixed-signal automatic test equipment (ATE) or an IC tester. The difficulty in testing embedded analog/mixed signal blocks is two-fold; first the access to the analog blocks so that test stimuli can be applied, and second observing the response of the analog blocks for evaluation. This difficulty is further enhanced due to the fact that these blocks require an analog signal as test input or their response output is an analog signal. Thus, a simple binary comparison cannot be conducted in testing.

In the conventional technology, as noted above, specialized mixed-signal test equipment such as a mixed-signal IC tester has been used to test the analog and mixed-signal blocks such as DACs and ADCs. The testing method is the same regardless of whether it is a monolithic DAC/ADC or embedded DAC/ADC. While the access to inputs and outputs in a monolithic DAC/ADC has been through the primary input-output pins, the test point insertion and design for test (DFT) logic have been used to access the input-outputs of embedded DAC/ADCs.

An offset voltage (Vos), full-scale range (FSR), all code values particularly missing codes and major transitions, differential non-linearity (DNL) and integral non-linearity (INL), etc. are the key parameters that are tested for DAC/ADCs. The generally used test methods for measuring the code transition levels to evaluate these parameters are an AC histogram method, a ramp histogram method and a code density test method.

In all the conventional approaches, a dedicated hardware has been used on a load-board near the device under test (DUT) in the ATE system. When the testing is performed by a mixed signal IC tester, the tester pin interface circuitry has been used for test pattern application and measurements while the response evaluation is done by the tester software. In some research projects on analog built-in self-test methods, dedicated on-chip hardware has been used for test generation and response evaluation (B. Dufort and G. W. Roberts, "On-chip analog signal generation for mixed-signal built-in self-test", IEEE J. Solid Stated Circuits, pp. 318–330, March 1999). However, such conventional methods require a substantial amount of additional hardware (overhead), resulting in the production efficiency decrease and the cost increase. Further, such hardware overhead causes a performance penalty, for example, a signal propagation delay.

SUMMARY OF THE INVENTION

Therefore, it is an object of the present invention to provide a method and structure for testing embedded analog and/or mixed-signal cores in a system-on-a-chip (SoC) IC, with substantially no increase in the hardware overhead in the SoC IC.

It is another object of the present invention to provide a method and structure for testing embedded analog/mixed-signal cores in a system-on-a-chip (SoC) IC, with substantially no performance disadvantage to the SoC IC.

It is a further object of the present invention to provide a method and structure for testing embedded analog/mixed signal cores in a system-on-a-chip (SoC) IC with high test efficiency and low cost.

One aspect of the present invention is a method of testing embedded analog cores in an integrated circuit chip having a microprocessor core and a memory core therein. The method is comprised of the steps of: providing a test register in the integrated circuit chip between the microprocessor core and an analog core to be tested; testing the microprocessor core and the memory core; using an assembly language test program running on the microprocessor core to generate a test pattern by the microprocessor core; applying the test pattern to the analog core by the microprocessor core and evaluating the response of the analog core either by the microprocessor core or a test system provided outside of the integrated circuit chip.

In the above test method, the microprocessor core first tested by executing microprocessor instructions multiple of times with pseudo random data and evaluating the results. The memory core is then tested by the microprocessor core which generates a memory test pattern and applies the memory test pattern to the memory core and evaluates the stored data in the memory core. The foregoing testing of the microprocessor core and memory core is the subject in the separate patent applications, U.S. application Ser. Nos. 09/170,179, 09/182,382 and 09/183,033 filed by the same inventors of the present invention.

Another aspect of the present invention is a structure for testing analog/mixed-signal cores. The structure is comprised of: a test register formed in the integrated circuit chip between the microprocessor core and an analog core to be tested, a multiplexer provided between the test register and the analog core for selectively providing data to the analog core; means for executing microprocessor instructions multiple times and evaluating the results to ensure integrity of the microprocessor core and for testing a memory core by generating a memory test pattern by the memory core and evaluating the results; and a host computer for providing an executable test program to the microprocessor core through an interface circuit; wherein the analog core is provided with a test pattern generated by the microprocessor core and the resultant output of the analog core is evaluated by either the microprocessor core or the host computer.

According to the present invention, the test method does not require large area overhead (it requires only a register and a multiplexer in a system-on-a-chip IC). Because the hardware overhead is negligible, the new test method causes no performance penalty. The present invention can avoid specialized test equipment and hence does not require dedicated observation and control points to be built in the design of the SoC IC. This method is applicable to standard product DAC/ADCs, as well as embedded analog/mixed signal cores in a microprocessors based system-on-a-chip.

BRIEF DESCRIPTION OF THE DRAWINGS

FIG. 5 shows an example of assembly language test program to be applied to a microprocessor core in an SoC IC from an external source for generating test signals to be applied to analog/mixed signal cores and evaluating the response therefrom.

DETAILED DESCRIPTION OF THE PREFERRED EMBODIMENT

The present invention provides a method and structure for testing analog and/or mixed signal cores in a system-on-chip (SoC) IC having a microprocessor core and a memory core. Typically, analog/mixed signal cores are ADCs (analog-to-digital converter) and DACs (digital-to-analog converter). In this test method, a microprocessor core is first tested, then the computation power of this microprocessor core is utilized to generate the test pattern for analog/mixed signal cores. The microprocessor core applies the test patterns to the analog/mixed signal cores to be tested and evaluate the test response thereof to determine a fault. The inventors of this application has described the method and structure for testing the microprocessor core in an SoC IC in U.S. patent application Ser. No. 09/182,382 filed Oct. 29, 1998. Except for negligible hardware added to the microprocessor core, this test method does not need any design modifications or additional circuits (hardware overhead) as used in the conventional design for-test (DFT) and built-in self-test (BIST) methods.

With respect to DAC/ADCs embedded in such an SoC IC, it should be noted that, inputs of an ADC are generally accessible while outputs thereof are not accessible. On the other hand, outputs of a DAC are generally accessible while inputs thereof are not accessible. Thus, the simplest form of testing a DAC is to generate test stimuli (patterns) within the chip (on-chip) since inputs of the DAC are not accessible while performing response evaluation by an external ATE (off-chip) since outputs are accessible. Similarly, the simplest form of testing an ADC is to generate and apply test stimuli from an ATE while performing response evaluation within the chip since outputs are not accessible.

Figure 1:
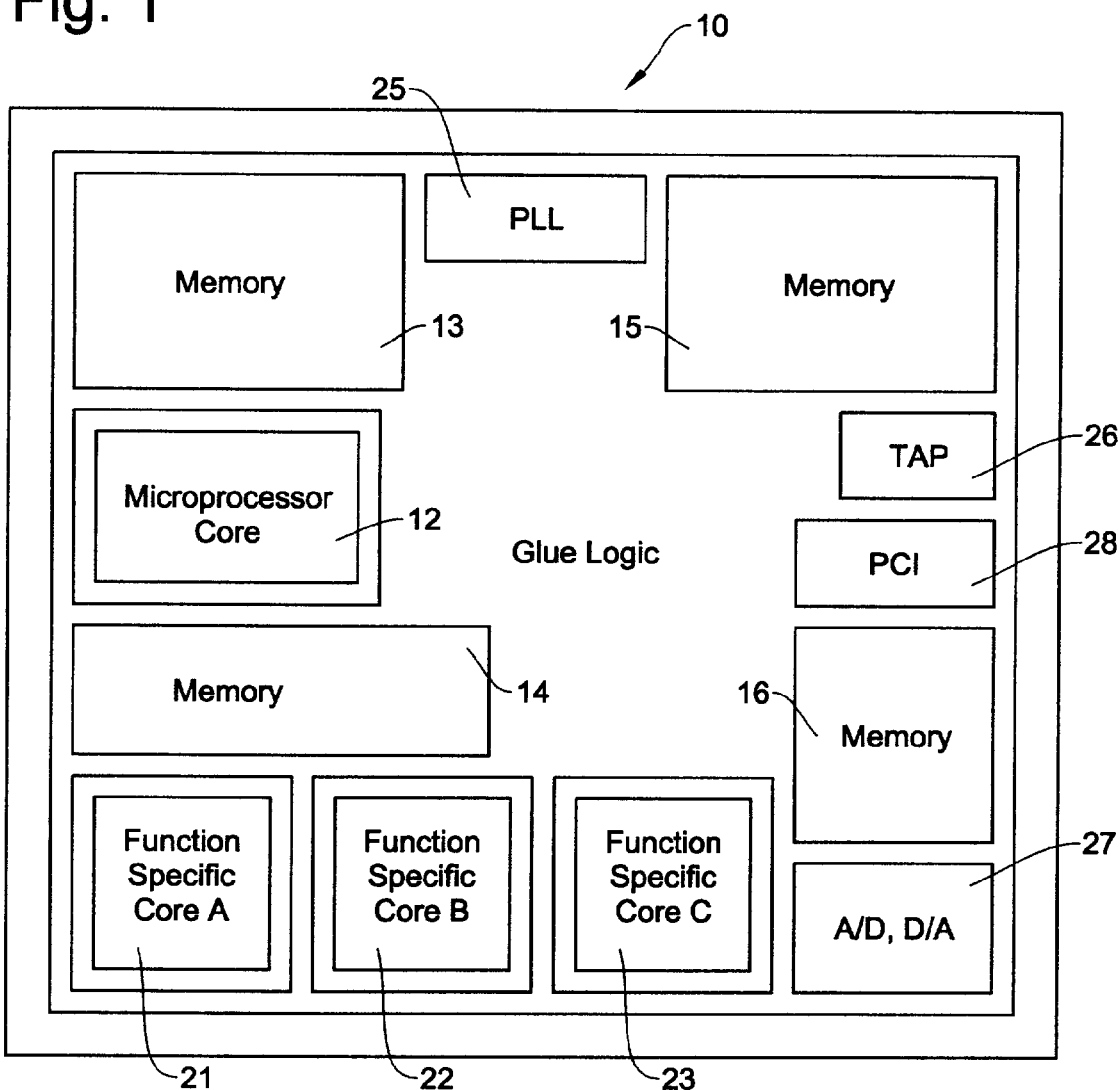
FIG. 1 is a schematic diagram showing an inner structure of a large scale integrated circuit (LSI) which is commonly called a system-on-chip (SoC) IC having a plurality of embedded cores.
Figure 2:
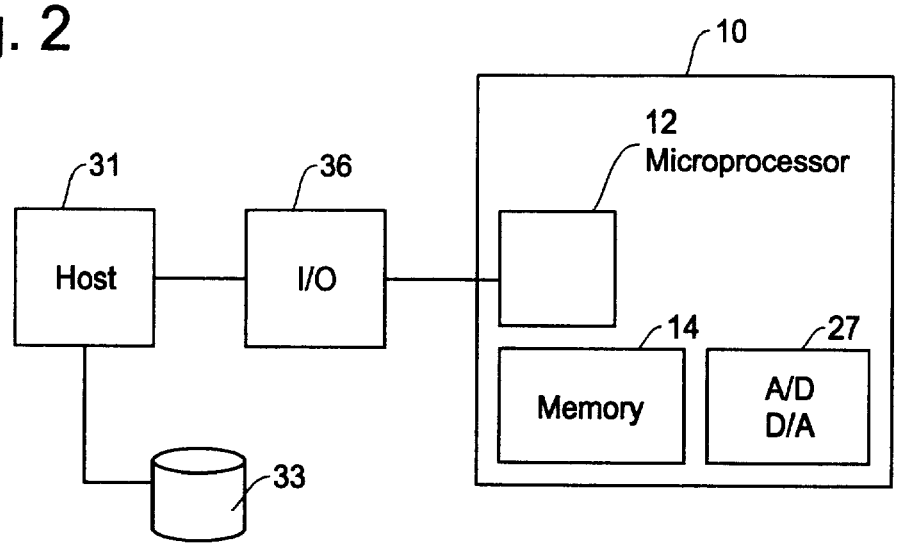
FIG. 2 is a schematic diagram showing an overall structure for testing an analog/mixed-signal core in an SoC IC in the present invention.

FIG. 2 is a schematic block diagram showing a structure for testing an analog/mixed-signal core in an SoC IC. In FIG. 2, automatic test equipment (ATE) including a host computer 31, a hard disk 33 and an I/O interface 36 are provided outside of the SoC IC. An example of ATE is a conventional IC tester. Typically, the hard disk 33 stores a test program to be used in testing the analog core in the SoC IC. The host computer 31 provides the executable code of assembly language test program to the microprocessor core 12 in the SoC chip through the I/O interface 36. The assembly language test program is converted into a binary form by the assembler of the microprocessor core 12. This assembler may reside in the host computer 31 outside the SoC. Thus, the microprocessor core 12 generates test patterns from the object code. These test patterns are applied to the analog/mixed-signal cores.

Figure 3:
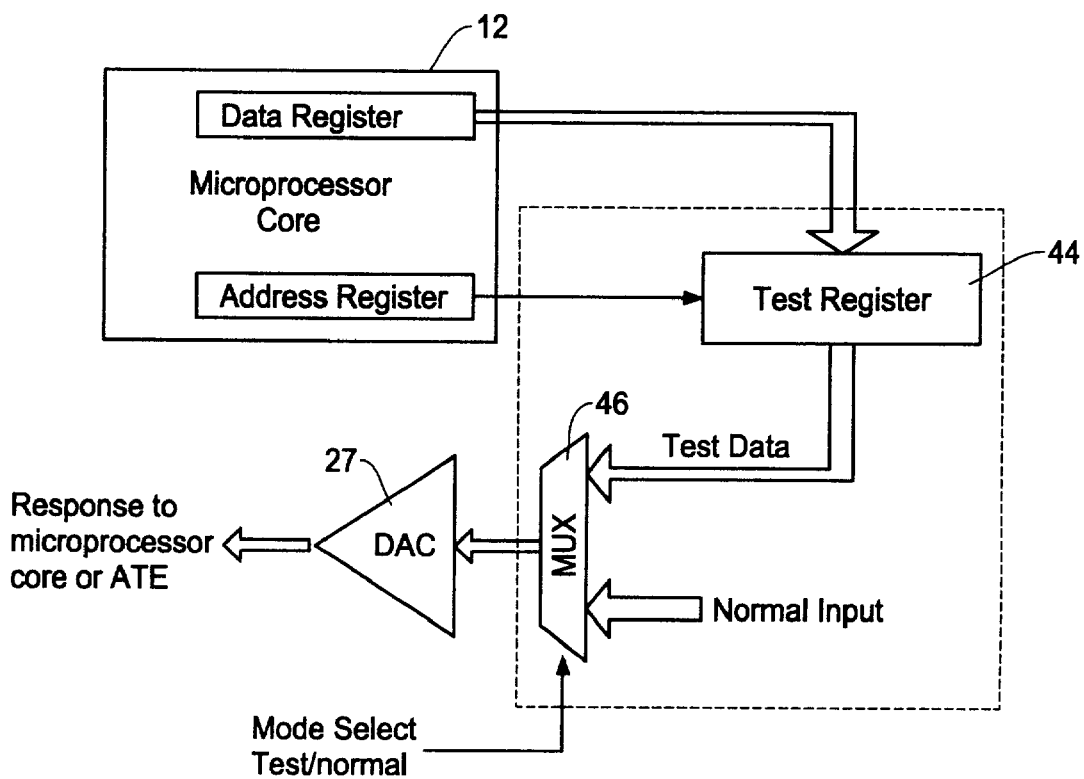
FIG. 3 is a schematic diagram showing a basic structure in an SoC IC for testing an analog and/or mixed-signal core in the SoC IC in the present invention.

FIG. 3 is a schematic block diagram showing a basic structure in an SoC IC for testing an analog/mixed-signal core in the SoC IC in the present invention. FIG. 3 shows a DAC 27 to be tested and a microprocessor core 12 as well as a test register 44 and a multiplexer 46. The test register 44 and the multiplexer 46 in a dotted line are only extra hardware that are added in the SoC IC.

The test register 44 is to apply test data (pattern) generated by the microprocessor core 12 to the DAC 27 to be tested. The test data in the test register 44 is provided from a data register in the microprocessor. The multiplexer 36 selectively transfers either the test data from the test register 44 or normal input data to the DAC 27 based on a is mode select signal. In the test mode, the multiplexer 46 provides the test data to the DAC 27 while in the normal mode, it provides normal input data to the DAC 27.

The contents of the test register 44 can be altered by index addressing, such as by addressing through any one of the microprocessor address registers. The implementation of the test register 44 can be an independent register or a dedicated memory location. The test register 34 and the multiplexer 46 can be implemented either independently or within the on-chip bus if such a bus exists on the chip.

In the configuration of FIGS. 2 and 3, the testing of ADC/DAC can be conducted by the microprocessor core 12 under the assumption that the microprocessor core 12 is fault free. The method and structure for testing such an embedded microprocessor core is described in U.S. patent application Ser. No. 09/182,382 filed Oct. 29, 1998 and U.S. patent application Ser. No. 09/183,033 filed Oct. 30, 1998 by the same inventors of the present invention. For this testing purpose, an assembly language program (written in the microprocessor's assembly language) is developed that generates the necessary test stimuli when executed by the microprocessor core 12. Such a test program is converted into binary codes using the microprocessor assembler. The binary code is stored in an ATE memory such as in the hard disc 33 and with the interface circuit 36 it is applied to the microprocessor core 12.

The microprocessor core 12 executes the binary code which consists of microprocessor instructions and data, thereby generating desired test patterns for DAC/ADC 27. The response of the DAC/ADC 27 against the test patterns is either evaluated concurrently by the microprocessor core 12 or stored in the on-chip memory for later evaluation. Alternatively, the response of the DAC/ADC core 27 is evaluated by the ATE (host computer 31).

In the case where the evaluation is also done by the microprocessor core 12, such an evaluation procedure is performed by executing another program on the microprocessor core 12, that is similarly developed in the assembly language, converted into the binary codes and applied to the microprocessor core 12. In response to this evaluation program, the microprocessor core 12 performs necessary calculation to evaluate the ADC/DAC response and determines if there is a fault therein. It should be noted that if the on-chip memory is not sufficient to store the ADC/DAC response, the response can be stored in the ATE memory and is evaluated by the ATE to determine pass/fail.

The foregoing sequence is summarized as follows:

Step 1: Test the microprocessor core and the memory core. A new method for such testing is described in the above noted patent applications by the same inventors of the present invention.

Step 2: Develop an assembly language program that can generate desired test patterns for DAC/ADC core 27 to be tested. The example procedure to generate the test patterns for various DAC/ADC parameters is given in FIG. 5.

Step 3: Use assembler of the microprocessor core 12 to generate object codes of the assembly language program. A generalized procedure for generating the object codes is described in the above noted patent applications.

Step 4: Apply the object codes to the microprocessor core 12 through an interface circuit.

Step 5: The microprocessor core 12 generates DAC/ADC test patterns and applies the test patterns to the DAC/ADC core 27 to be tested.

Step 6: The microprocessor core 12 collects and evaluates the response of the DAC/ADC cores signals Testing of embedded memory core. In one aspect, the response is collected in the on-chip memory. The microprocessor core 12 executes the test evaluation program and computes specific parameter values. Based on these values, the microprocessor core 12 determines pass/fail and sends this information to the host computer. In another aspect, the response is collected in the host computer in the ATE or other tester. The host computer executes a program to compute various parameters and determines pass/fail. This program needs not to be in the assembly language.

Figure 4A:
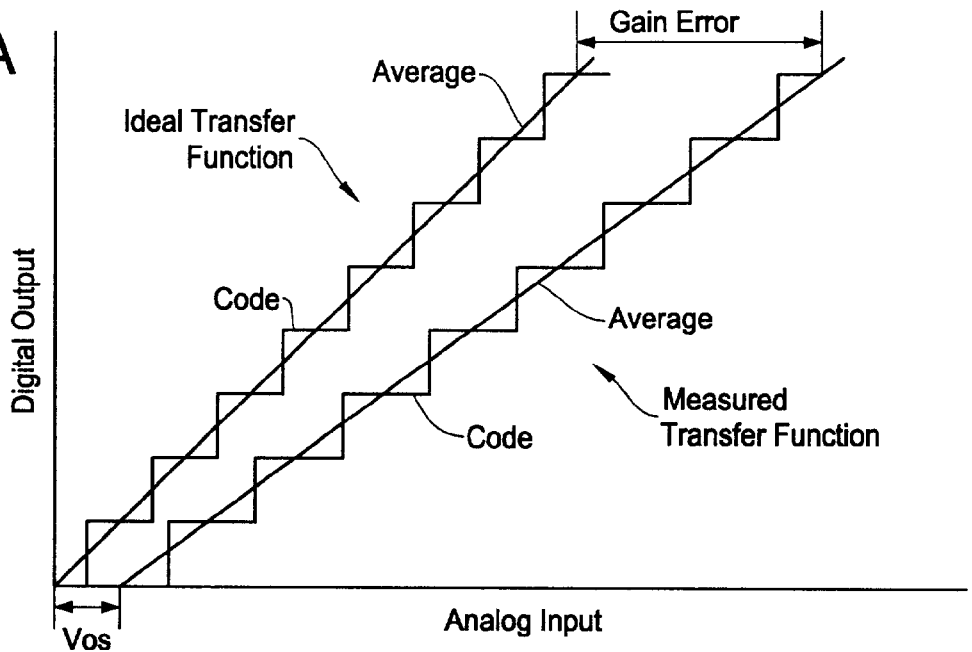
FIGS. 4A and 4B are schematic diagrams showing graphical illustrations of various test parameters involved in analog cores such as DAC/ADCs.
Figure 4B:
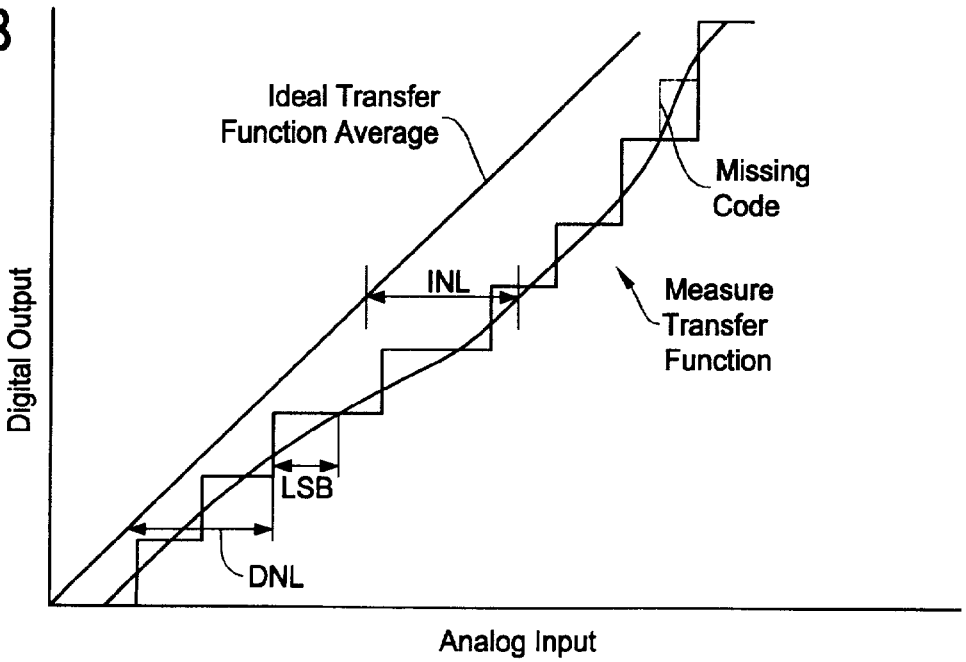

FIGS. 4A and 4B show various test parameters involved in analog cores such as digital-to-analog converters (DAC) and analog-to-digital converters (ADC). With reference to FIGS. 4A and 4B, typical test parameters are as follows:

(P1) Offset Voltage (Vos): For DAC, an offset voltage Vos is an analog output voltage when a null or all-zero code is applied at the inputs. The width of the test vector is the same as the width of DAC resolution bit, while the length is $2^N$, such as 16, 32, 64 etc. Further to avoid distortion due to noise, the same vector is applied multiple times and an average of response outputs is taken to compute the offset voltage Vos. The test vector is obtained simply by loading all-0 to one of the microprocessor data registers. A single microprocessor instruction "MVIOOOOH, Di" is used for this purpose, where Di is the i-th data register. In the example of FIG. 5, instead of i-th register, a register D1 has been used for illustration.

(P2) Full Scale Range (FSR): For DAC, a full-scale range FSR is the difference between an analog output voltage when the full-scale code (all-1) value ($V_{FS}$) is applied at the inputs and an analog output voltage when a null (all-0) code value (Vos) is applied at the inputs, such as FSR=$V_{FS}$–Vos. The test stimulus for the full scale voltage $V_{FS}$ is all-1 value, thus, the procedure is the same as generating test vector for the offset voltage Vos. Thus, two instructions provide the necessary test stimuli for FSR (all-0 and all-1 values).

(P3) Missing Codes and Major Transitions: For DAC, a major transition is the transition between codes that causes a carry to flip the least significant non-zero bit and sets the next bit. For N-bits DAC, a counter that counts from 0 to $2^N$–1 provides all possible code values, thus, it is sufficient to test for any missing codes and major transitions. An assembly language program provides such count functionality. It should be noted that for the code transition testing, only major code transitions may be sufficient, such as 1/4, 1/2 and 3/4 of full-scale values instead of applying all code values.

(P4) Differential Non-linearity: For DAC, it is the maximum deviation of an actual analog output step between adjacent input codes from the ideal value of 1 (one) LSB (least significant bit). It requires all-0, all-1 and a linear sequence of all code inputs. Thus, the combined procedures given in the above parameters P2 and P3 provide the necessary test stimuli.

(P5) Integral Non-linearity: For DAC, it is the maximum deviation of the code edges or analog output from a straight line drawn between first and last codes. Thus, the combined procedures given in the above parameters P2 and P3 provide the necessary test stimulus.

After applying the test patterns to the DAC/ADC to be tested, the above noted parameters are obtained by the following procedure. Although the computation method is generalized for illustration purpose, an example below shows the use of digitized output response of the DAC.

(S1) Offset Voltage (Vos): As mentioned above, to eliminate noise distortion, it is preferable to apply all-0 vector multiple times and obtain an average value thereof. To compute Vos, output of the DAC is accumulated in one of the data registers of the microprocessor core 12 for $2^N$ times, where N being an integer. The accumulated value is shifted-right N-bits, which is equivalent to a divide operation, to obtain the average value.

(S2) Full Scale Range (FSR): For DAC, it is FSR=$V_{FS}$–Vos where $V_{FS}$ is a measured full scale voltage and Vos is a measured offset voltage. The mechanism to obtain the full scale voltage $V_{FS}$ is the same as that of the offset voltage Vos, except that for the full scale $V_{FS}$ the input vector is all-1 instead of all-0. Hence, for the full scale range FSR, outputs of DAC 27 under all-0 are accumulated in one data register (D1) and outputs of DAC 27 under all-1 are accumulated in another data register (D2). The contents of both data registers D1 and D2 are shift-right N-bits to obtain the voltages $V_{FS}$ and Vos. Finally, difference between the registers D2 and D1, i.e. D2–D1 provides the full scale range FSR. The calculated value FSR can be saved in another data register (D3). The foregoing steps are as follows:

(S2-a) Obtain the offset voltage Vos as described in the process (S1). Save the value Vos in the data register D1.

(S2-b) Obtain $V_{FS}$ as under all-1 with procedure as described in the process (S2). Save the value $V_{FS}$ in the data register D2.

(S2-c) Perform subtraction D2–D1 to obtain the full scale range FSR. Save the value FSR in the data register D3. Such data registers D1–D3 can be implemented by assigning inner registers in the microprocessor core or memory locations in the memory cores in the SoC IC.

(S3) Missing Codes and Major Transitions: The DAC output is digitized and stored in an on-chip memory or in an ATE memory such as the hard disc 33. Two additional data registers (D4 and D5) are used to store digitized outputs under two successive code values. Such data registers D1–D5 can be implemented by assigning inner registers in the microprocessor core or memory locations in the memory cores in the SoC IC. As described in the foregoing, a counter (implemented in assembly language) applies the code values to DAC 27 under test. The contents of the data registers D4 and D5 show the code transitions. A missing code is detected when either the register D4 or register D5 gets a null value. The difference between the values of D4 and D5 identifies the major transitions.

(S4) Differential Non-linearity (DNL): After the full scale range FSR is computed, a further divide operation is performed to obtain the LSB (least significant bit) size. Two additional data registers (D4 and D5) are used to store digitized outputs under two successive codes while a counter applies the code values to DAC under test as described in the foregoing. The subtraction of the data D4 from D5 provides DNL. The calculated DNL can be further compared with a pre-determined maximum value to generate a pass/fail flag. The foregoing steps are:

(S4-a) Obtain offset voltage Vos as described in the process (S1) and save the value Vos in the data register D1. Obtain full scale voltage $V_{FS}$ as described in the step (S2-b). Save this value in register D2. Obtain FSR as described in the step (S2-c).

(S4-b) Divide FSR by $2^N-1$ to obtain the LSB size. Save this value in a register D6.

(S4-c) Apply the binary sequences from 0 to $2^N-1$ as described with respect to the step (S3) regarding the missing code and major transitions.

(S4-d) Put digitized output under each successive code in the registers D4 and D5. Compute the difference D4–D5 to obtain DNL.

(S4-e) Compare the computed DNL with predetermined DNL. If computed DNL is greater than the predetermined DNL, generate a fail flag.

The main benefit of this test method is that embedded analog/mixed-signal circuits can be tested very efficiently with negligible area overhead. The present invention avoids specialized test equipment and hence does not require dedicated observation and control points be built in the design. Although, we used ADC/DAC as examples, the method is generalized and applicable to any analog/mixed-signal circuit.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A method for testing an embedded analog core in an integrated circuit chip having a microprocessor core and a memory core therein, comprising the following steps of:
   providing a test register in the integrated circuit chip between the microprocessor core and an analog core to be tested;
   testing the microprocessor core by executing microprocessor instructions multiple of times and evaluating the results;
   using an assembly language test program running on the microprocessor core to generate a test pattern by the microprocessor core;
   applying the test pattern to the analog core by the microprocessor core and evaluating the response of the analog core either by the microprocessor core or a test system provided outside of the integrated circuit chip.

2. A method for testing an embedded analog core as defined in claim 1, further including a step of testing the memory core before testing the analog core by the microprocessor core which generates a memory test pattern and applies the memory test pattern to the memory core and evaluates the stored data in the memory core.

3. A method for testing an embedded analog core as defined in claim 1, wherein the test program applied to the microprocessor core is an object code of assembly language test program.

4. A method for testing an embedded analog core as defined in claim 3, wherein the assembly language test program is provided to the microprocessor core from an external host computer through an I/O interface.

5. A method for testing an embedded analog core as defined in claim 3, wherein the assembly language test program is provided to the microprocessor core from an external IC tester through an I/O interface.

6. A method for testing an embedded analog core as defined in claim 1, wherein the integrated circuit chip is a system-on-a-chip IC.

7. A method for testing an embedded analog core as defined in claim 1, wherein the embedded analog core is an analog-to-digital converter (ADC) and/or a digital-to-analog converter (DAC).

8. A structure for testing an embedded analog core in an integrated circuit chip having a microprocessor core and a memory core therein, comprising:
   a test register formed in the integrated circuit chip between the microprocessor core and an analog core to be tested;
   a multiplexer provided between the test register and the analog core for selectively providing data to the analog core;
   means for executing microprocessor instructions multiple times and evaluating the results to ensure integrity of the microprocessor core and for testing a memory core by generating a memory test pattern by the memory core and evaluating the results; and
   a host computer for providing an executable test program to the microprocessor core through an interface circuit;
   wherein the analog core is provided with a test pattern generated by the microprocessor core and the resultant output of the analog core is evaluated by either the microprocessor core or the host computer.

9. A structure for testing an embedded analog core as defined in claim 8, wherein the test register transfers test data from the microprocessor core to the analog core to be tested through the multiplexer when a test mode signal is provided to the multiplexer.

10. A structure for testing an embedded analog core as defined in claim 8, wherein the memory core test is performed before testing the analog core by the microprocessor core which generates a memory test pattern and applies the memory test pattern to the memory core and evaluates the stored data in the memory core.

11. A structure for testing an embedded analog core as defined in claim 8, wherein the test program applied to the microprocessor core is an object code of assembly language test program.

12. A structure for testing an embedded analog core as defined in claim 11, wherein the assembly language test program is provided to the microprocessor core from an external host computer through an I/O interface.

13. A structure for testing an embedded analog core as defined in claim 11, wherein the assembly language test program is provided to the microprocessor core from an external IC tester through an I/O interface.

14. A structure for testing an embedded analog core as defined in claim 8, wherein the integrated circuit chip is a system-on-a-chip IC.

15. A structure for testing an embedded analog core as defined in claim 8, wherein the embedded analog core is an analog-to-digital converter (ADC) and/or a digital-to-analog converter (DAC).

* * * * *